(12) United States Patent
Karasaki et al.

(10) Patent No.: US 10,896,849 B2
(45) Date of Patent: Jan. 19, 2021

(54) METHOD OF DICING A SEMICONDUCTOR WAFER USING A PROTECTIVE FILM FORMED BY COATING A MIXTURE OF WATER-SOLUBLE RESIN AND ORGANIC SOLVENT

(71) Applicant: Panasonic Intellectual Property Management Co., Ltd., Osaka (JP)

(72) Inventors: Hidehiko Karasaki, Hyogo (JP); Shogo Okita, Hyogo (JP); Noriyuki Matsubara, Yamanashi (JP); Hidefumi Saeki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/426,116

(22) Filed: May 30, 2019

(65) Prior Publication Data

US 2019/0371669 A1    Dec. 5, 2019

(30) Foreign Application Priority Data

Jun. 5, 2018    (JP) .................................. 2018-107943

(51) Int. Cl.
*H01L 21/78* (2006.01)
*B23K 26/40* (2014.01)
(Continued)

(52) U.S. Cl.
CPC ............ *H01L 21/78* (2013.01); *B23K 26/364* (2015.10); *B23K 26/40* (2013.01);
(Continued)

(58) Field of Classification Search
CPC ............ H01L 21/3065; H01L 21/6836; H01L 21/68327; H01L 21/268; H01L 21/67069;
(Continued)

(56) References Cited

U.S. PATENT DOCUMENTS 8,883,615 B1 * 11/2014 Holden ............... H01L 21/3081
438/462
2006/0105544 A1    5/2006 Takanashi et al.
(Continued)

FOREIGN PATENT DOCUMENTS

JP    2006-140311 A    6/2006
JP    2008-053417 A    3/2008

*Primary Examiner* — Ermias T Woldegeorgis
(74) *Attorney, Agent, or Firm* — Pearne & Gordon LLP

(57) ABSTRACT

A substrate has first and second surfaces, and includes a plurality of element regions and dividing region defining the element regions. A method for manufacturing an element chip includes: a step of spray coating, to the first surface of the substrate, a mixture containing a water-soluble resin and an organic solvent having a higher vapor pressure than water, and drying the coated mixture at a temperature of 50° C. or less, to form a protective film; a laser grooving step of removing portions of the protective film covering the dividing regions; a step of dicing the substrate into element chips by plasma etching the substrate; and a step of removing the portions of the protective film covering the element regions. The mixture has a solid component ratio of 200 g/L or more, and droplets of the sprayed mixture have an average particle size of 12 μm or less.

6 Claims, 6 Drawing Sheets

(51) Int. Cl.
*H01L 21/3065* (2006.01)
*B23K 26/364* (2014.01)
*H01L 21/308* (2006.01)
*H01L 21/02* (2006.01)
*B23K 101/40* (2006.01)

(52) U.S. Cl.
CPC .... H01L 21/02076 (2013.01); H01L 21/3081 (2013.01); H01L 21/30655 (2013.01); *B23K 2101/40* (2018.08)

(58) Field of Classification Search
CPC ........... H01L 21/31138; H01L 21/0274; H01L 21/308; H01L 21/0337; H01L 21/3086; H01L 21/67092; H01L 21/78; H01L 21/82; H01L 21/30655; H01L 21/3081; H01L 21/02076; B23K 26/364; B23K 2101/40

See application file for complete search history.

(56) References Cited

U.S. PATENT DOCUMENTS

| | | | |
|---|---|---|---|
| 2010/0055875 A1 | 3/2010 | Haji et al. | |
| 2012/0322240 A1* | 12/2012 | Holden | B23K 26/40 438/462 |
| 2016/0035577 A1* | 2/2016 | Lei | B23K 26/40 438/462 |

* cited by examiner

METHOD OF DICING A SEMICONDUCTOR WAFER USING A PROTECTIVE FILM FORMED BY COATING A MIXTURE OF WATER-SOLUBLE RESIN AND ORGANIC SOLVENT

CROSS REFERENCE TO RELATED APPLICATION

The present application is based on and claims priority under 35 U.S.C. § 119 with respect to the Japanese Patent Application No. 2018-107943 filed on Jun. 5, 2018, of which entire content is incorporated herein by reference into the present application.

TECHNICAL FIELD

The present disclosure relates to a method for manufacturing an element chip that uses plasma etching.

BACKGROUND

Conventionally, when dicing a semiconductor substrate into a plurality of element chips, processing grooves are formed in advance along portions to be diced (also referred to as "streets" or "dividing regions") by a grooving step (laser grooving step) using laser light, prior to dicing. Then, dicing is performed by cutting the substrate along the processing grooves using a cutting blade or laser light. To prevent processing debris generated by laser light from attaching to the substrate in the laser grooving step, a mask (protective film) is formed to protect the element regions, prior to the laser grooving step. As the mask, a coating film of a water-soluble resin may be used. The use of a coating film of a water-soluble resin as the mask is convenient because the mask can be removed using water. As described in Japanese Laid-Open Patent Publication No. 2006-140311, polyvinyl alcohol, which is readily available and inexpensive, is often used as the water-soluble resin.

Meanwhile, in recent years, a technique that uses dicing for plasma etching has been proposed (Japanese Laid-Open Patent Publication No. 2008-53417). The use of plasma etching enables a semiconductor substrate to be divided into many element chips at one time, and is therefore advantageous in terms of cost. In dicing that uses plasma etching (plasma dicing) as well, prior to the plasma etching, laser grooving is performed in which the portions of the protective film that cover the dividing regions are removed using laser light (Japanese Laid-Open Patent Publication No. 2008-53417).

SUMMARY

An aspect of the present disclosure relates to a method for manufacturing an element chip,
the method including:
a preparation step of preparing a substrate, the substrate having a first surface and a second surface opposite to the first surface, and including a plurality of element regions and dividing regions defining the element regions, the substrate being held on a holding sheet on the second surface side;
a protective film formation step of spray coating, to the first surface of the substrate, a mixture containing a water-soluble resin and an organic solvent having a higher vapor pressure than water to form a coating film of the mixture, and drying the coating film at a temperature of 50° C. or less, to form a protective film containing the water-soluble resin;
a laser grooving step of irradiating, with laser light, portions of the protective film that cover the dividing regions, to remove the portions covering the dividing regions, and expose the first surface of the substrate in the dividing regions;
a dicing step of dicing the substrate into a plurality of element chips by plasma etching the substrate from the first surface to the second surface in the dividing regions in a state in which the element regions are covered by the protective film; and
a removal step of removing the portions of the protective film that cover the element regions,
wherein the mixture has a solid component ratio of 200 g/L or more, and
droplets of the sprayed mixture have an average particle size of 12 μm or less.

DETAILED DESCRIPTION

Figure 1:
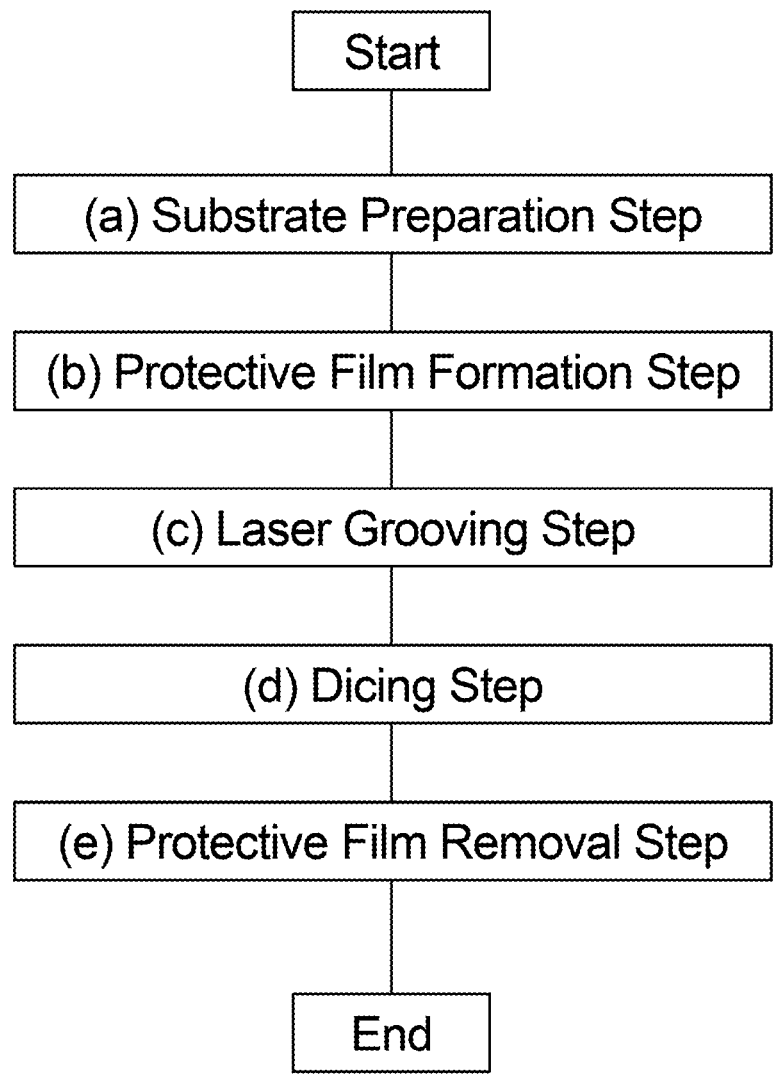
FIG. 1 is a flowchart showing a method for manufacturing an element chip according to an embodiment of the present disclosure.

A novel feature of the present invention is set forth in the appended claims, but the present invention will be more clearly understood, in terms of both configuration and content, from the detailed description given below with reference to the accompanying drawings together with other objects and features of the present invention.

In plasma dicing, the protective film is exposed to plasma by plasma treatment, and it is therefore necessary to form a relatively thick protective film, unlike in the case of the conventional dicing that uses a blade, laser light, or the like.

However, if a water-soluble resin is used, it is difficult, in the first place, to increase the thickness of the protective film. Moreover, application may need to be repeated many times, or time may be required to perform drying. This results in the problem that element chips cannot be manufactured with a high productivity.

According to the present disclosure, it is possible to manufacture element chips with a high productivity in dicing that uses plasma etching.

An embodiment of the method for manufacturing an element chip according to the present disclosure will be described with reference to the accompanying drawings. In the description of the embodiment, terms (e.g., "upper") that are used to indicate directions in order to facilitate the understanding are merely illustrative, and these terms are not intended to limit the present disclosure. In the drawings, constituent parts are illustrated in relative dimensions in order to clarify the shape and the characteristics thereof, and are not necessarily shown with the same scale ratio.

As schematically shown in the flowchart in FIG. 1, a method for manufacturing an element chip according to an aspect of the present disclosure includes the steps of: (a) preparing a substrate that includes a plurality of element regions, and dividing regions defining the element regions, and that is held by a holding sheet (substrate preparation step); (b) forming a protective film containing a water-soluble resin by using a mixture containing the water-soluble resin and a solvent (protective film formation step); (c) removing portions of the protective film that cover the dividing regions by irradiation with laser light (laser grooving step); (d) dicing the substrate into a plurality of element chips in the dividing regions by plasma etching the substrate from a front surface to a back surface (dicing step); and (e) removing the protective film (protective film removal step). In the protective film formation step, a mixture containing a water-soluble resin and an organic solvent having a higher vapor pressure than water is spray coated to the surface (first surface) of the substrate that is opposite to the holding sheet, and the resultant coating film of the mixture is dried at a temperature of 50° C. or less, to form a protective film containing the water-soluble resin. Here, the mixture has a solid component ratio of 200 g/L or more, and droplets of the sprayed mixture have an average particle size of 12 μm or less.

Irregularities due to pad electrodes, bumps, and the like may be provided on the surface of a commonly used element. In general, when dicing the substrate to manufacture element chips, a protective film for protecting the surface of the substrate is formed. In the conventional dicing in which a cutting blade is used after processing grooves using laser light (laser grooving), it is sufficient that debris generated during the laser grooving can be prevented from attaching to the substrate. Therefore, the protective film has a small thickness, usually, a thickness less than 1 μm. However, it has been found that when the substrate on which such a protective film is formed is diced by plasma etching, the plasma etching cannot be performed uniformly.

If the thickness of the protective film is less than 1 μm, areas in which the protective film is thinly coated may be produced, depending on the surface structure of the element regions, or the coverage of the surface irregularities by a protective film forming material. If the areas where the protective film is thinly coated exist, the protective film may be eliminated in the thinly coated areas during plasma etching, so that the surfaces of the element regions may be exposed to plasma, resulting in pinhole-like processing marks. Furthermore, if the electrode section is exposed at the portions where the protective film has been eliminated, an electrical damage may be caused to the elements, or the inner wall of a plasma etching device may be contaminated with the metals from the electrode section.

When the substrate is subjected to a plasma treatment, a cured layer or a modified layer may be formed on the surface of the water-soluble protective film, or the polymerization of the materials constituting the protective film may progress. As a result, the solubility of the water-soluble protective film is reduced. If the thickness of the protective film is less than 1 μm the cured layer, the modified layer, or the polymerized layer tend to extend not only over the surface layer, but also over the entire depth direction of the substrate. In this case, even if the protective film remaining after plasma etching is subjected to water washing or the like, it will be difficult to remove the protective film cleanly.

After performing dicing by plasma etching, it is possible to expose the cured layer, the modified layer, or the polymerized layer to a plasma of oxygen, to remove these layers, and then remove the protective film by water washing. However, if the thickness of the protective film is less than 1 the protective film may be partially or entirely removed during the oxygen plasma treatment. This is not preferable because the surfaces of the element regions are exposed to the plasma in the portions where the protective film has been removed, and the elements are thus damaged. Therefore, when performing plasma etching, it is necessary to form a protective film having a large thickness.

In Japanese Laid-Open Patent Publication No. 2008-53417, the protective film is formed using an aqueous solution of polyvinyl alcohol (PVA). However, the present inventors have found that the following new problems occur when a protective film having a large thickness is to be formed using such a conventional coating solution.

First, PVA tends to increase the viscosity of the coating solution. Accordingly, if the viscosity of an aqueous solution is reduced in order to ensure a certain degree of applicability, it is difficult to apply the coating solution in a large thickness by a single operation of spin coating or spray coating. Therefore, in order to increase the thickness, it is necessary to perform application a plurality of times. Moreover, a coating film that has been formed using an aqueous solution requires a long time for drying. Accordingly, in the case of repeating application for a plurality of times, the underlying coating film is redissolved by the influence of the moisture contained in a coating film newly applied thereon. Thus, with the use of the conventional coating solution, it is difficult, in the first place, to form a protective film having a large thickness by using a water-soluble resin, regardless of the coating method used. Note that, in order to form a protective film having a large thickness, it is conceivable, for example, to provide a heating mechanism in an application stage, and apply the coating film in multiple layers, while drying the coating film under heating. However, it is not preferable to perform heating/drying because the dicing tape has low heat resistance.

With the method according to the present disclosure, the mixture has a solid component ratio of 200 g/L or more, and it is thus possible to form a thick protective film with a small number of times of application operations even when using spray coating. If the thickness of a protective film containing a water-soluble resin is increased, it becomes difficult to dry the protective film, and the quality of the protective film is reduced. However, since the organic solvent having a higher vapor pressure than water is used, and the droplets have an average particle size of 12 μm or less, the droplets will be substantially dried upon impacting on the surface of the substrate or the surface of the coating film. Thus, drying can be performed smoothly even at a low temperature of 50° C. or less. As a result, a thick protective film suitable for plasma etching can be formed easily and quickly, making it possible to increase the productivity of the manufacture of element chips. In addition, a protective film having a good quality and a large thickness can be formed, and it is thus possible to perform more uniform dicing by plasma etching. Furthermore, due to the low drying temperature, the degradation of the dicing tape can also be suppressed, which also makes it possible to perform more uniform dicing.

In the following, each of the steps will be described more specifically.

(a) Substrate Preparation Step

A substrate that is prepared in a substrate preparation step is diced into a plurality of element chips by using a plasma etching technique. The substrate may be a semiconductor substrate such as a silicon wafer, a resin substrate such as a flexible printed substrate, a ceramic substrate, or the like, and the semiconductor substrate may be formed of silicon (Si), gallium arsenide (GaAs), gallium nitride (GaN), silicon carbide (SiC), or the like. The present disclosure is not limited by the materials and the like of the substrate.

Figure 2:
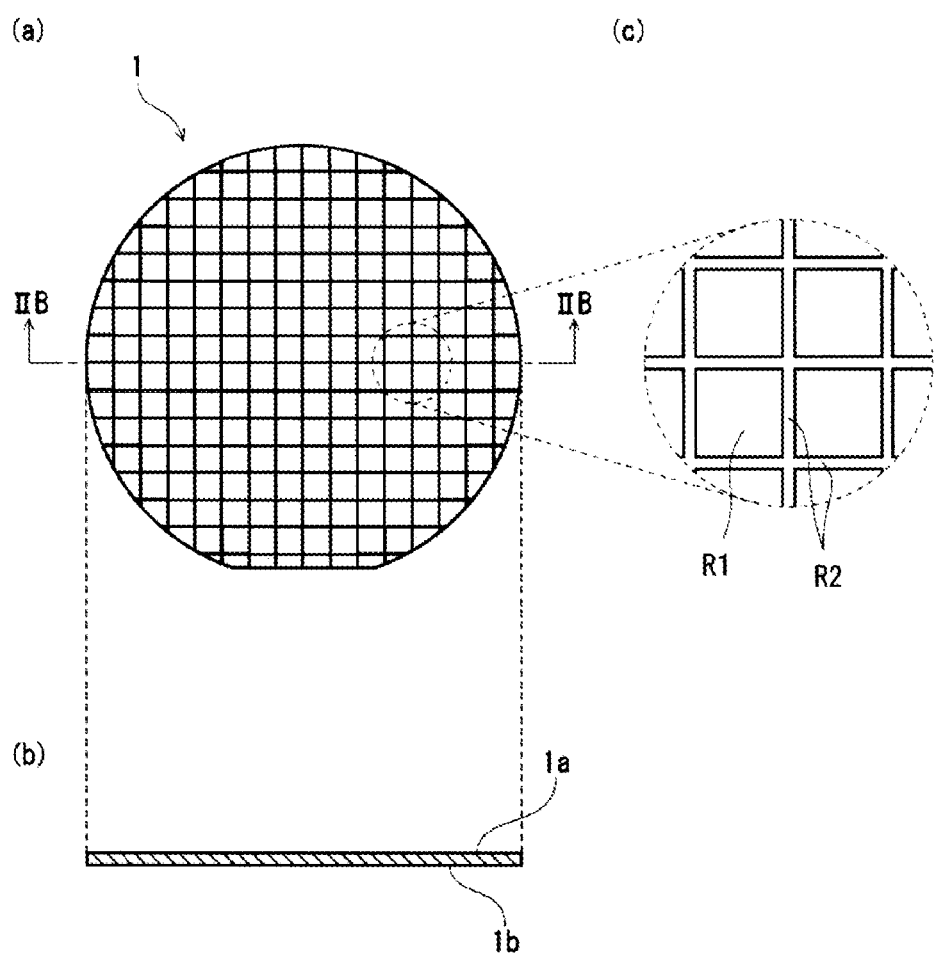
FIG. 2 is a schematic diagram for illustrating a substrate.

FIG. 2 is a schematic diagram for illustrating a substrate 1. (a) of FIG. 2 is a plan view of the substrate 1 as viewed from above, (b) of FIG. 2 is a cross-sectional view taken along the line IIB-IIB in (a) of FIG. 2, and (c) of FIG. 2 is a partial enlarged view of (a) of FIG. 2. As shown in (b) of FIG. 2, the substrate 1 includes a first surface 1a and a second surface 1b (hereinafter also referred to as "front surface 1a" and "back surface 1b") that oppose each other. As shown in (c) of FIG. 2, the substrate 1 includes, on the front surface 1a thereof, a plurality of element regions R1, and dividing region R2 defining the element regions R1. Each of the element regions R1 of the substrate 1 includes an integrated circuit constituting a desired electric circuit, and will constitute an element chip after a plasma etching step. The dividing regions R2 constitute dicing lines.

Usually, an electric integrated circuit is formed in each element region R1, and an exposed circuit, a bump, and the like are present. The electric circuit on the front surface 1a of each of the element regions R1 may include a circuit layer of a semiconductor circuit, an electronic component element, a MEMS, or the like. However, the circuit layer is not limited thereto. The circuit layer may be configured as a multilayer stack including an insulating film, a conductive layer, a resin protective layer, an electrode pad, a terminal section, and so forth. The bump is connected to the terminal section of the multilayer stack.

After the multilayer stack is formed, the back surface 1b of the substrate 1 may be polished in order to reduce the thickness of the substrate 1. More specifically, the front surface 1a including the circuit layer may be protected by being covered with backgrind (BG) tape, and the back surface 1b of the substrate 1 may be polished.

Figure 3:
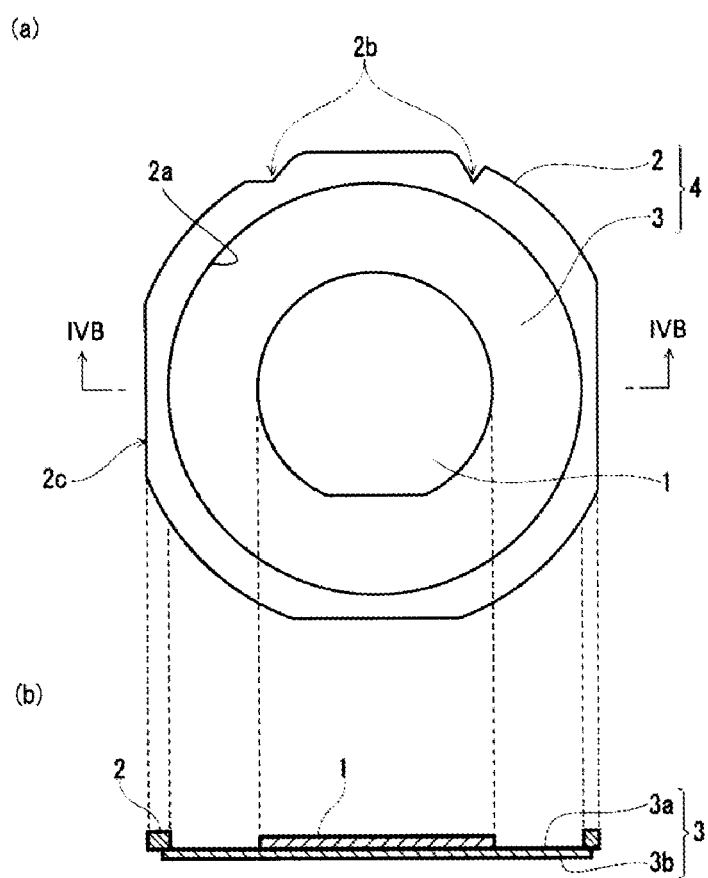
FIG. 3 is a schematic diagram for illustrating a substrate fixed to a transport carrier.

The substrate 1 has any planar shape, for example, a substantially circular planar shape as shown in (a) of FIG. 3. Besides a circular shape, the planar shape of the substrate 1 may be rectangular, and may have an orientation flat ((a) of FIG. 3), and a cutout such as a notch. The maximum diameter of the substrate 1 is not particularly limited, and is, for example, 50 mm or more and 300 mm or less, and the thickness thereof is not particularly limited, and is, for example, 10 μm or more and 800 μm or less.

The substrate 1 is held by a holding sheet 3 on the second surface side when a desired electric integrated circuit is formed in each element region R1, or at least before a protective film formation step described below. The frame 2 may be held by the holding sheet 3 in advance. Alternatively, the frame 2 may be held by the holding sheet 3 after the substrate 1 has been held by the holding sheet 3. (a) of FIG. 3 is a plan view of the substrate 1 and the frame 2 that are fixed to the holding sheet 3, as viewed from above, and (b) of FIG. 3 is a cross-sectional view taken along the line IVB-IVB in (a) of FIG. 3. The holding sheet 3 has an upper surface (adhesive surface 3a) that contains an adhesive agent, and a lower surface (non-adhesive surface 3b) that does not contain an adhesive agent. As a result of the substrate 1 and the frame 2 being fixed to the adhesive surface 3a, the holding sheet 3 holds the substrate 1 and the frame 2 from the back surface 1b side of the substrate 1. The frame 2 has an annular shape including a circular opening 2a. The frame 2 is held by the holding sheet 3 such that the opening 2a and the substrate 1 are disposed concentrically, and the adhesive surface 3a is exposed in the opening 2a that is not covered by the substrate 1. In the present specification, a combination of the holding sheet 3 and the frame 2 fixed thereto is referred to as a "transport carrier 4", and the substrate 1 that is fixed to the transport carrier 4 is also referred to as a "carrier-equipped substrate 1". Even though the substrate 1 itself is thin, the substrate 1 is held by the transport carrier 4, and therefore can be easily operated and transported in a subsequent step.

The base material of the holding sheet 3 is formed using a thermoplastic resin such as polyolefins, including, for example, polyethylene and polypropylene, and polyesters including, for example, polyethylene terephthalate. The holding sheet 3 may have stretchability so as to be removed from the frame 2 after a protective film removal step described below, and be expanded in the radial direction to widen the intervals between the individual element chips, thus allowing the element chips to be easily picked up from the adhesive surface 3a. The base material of the holding sheet 3 may contain various additives such as a rubber component for providing stretchability (e.g., an ethylene-propylene rubber (EPM), an ethylene-propylene-diene rubber (EPDM)), a plasticizer, a softening agent, an antioxidant, and a conductive material. The thermoplastic resin may include a functional group exhibiting photopolymerization reaction, such as an acrylic group. The thickness of the base material of the holding sheet 3 is not particularly limited, and is, for example, 50 μm or more and 150 μm or less.

On the other hand, the adhesive surface 3a of the holding sheet 3 is preferably made of an adhesive component whose adhesive force can be reduced. This is to allow the diced element chips to be more easily picked up from the adhesive surface 3a by irradiation with ultraviolet light (UV light) after a dicing step described below. The holding sheet 3 may be formed, for example, by applying, onto one surface of a film-like base material, a UV-curable acrylic adhesive agent in a thickness of 5 μm or more and 20 μm or less.

The frame 2 has a rigidity sufficient to be able to transport the substrate 1 and the holding sheet 3 in a state in which the substrate 1 and the holding sheet 3 are held thereby. The opening 2a of the frame 2 may have a polygonal shape such as a rectangular shape or a hexagonal shape, in addition to the above-described circular shape. As shown in FIG. 3, the frame 2 may include notches 2b or corner cuts 2c for positioning. The frame 2 may be formed using, for example, a metal such as aluminum and stainless steel, or a resin.

(b) Protective Film Formation Step

In a protective film formation step, a protective film containing a water-soluble resin is formed by applying, to the front surface 1a of the substrate 1, a mixture containing the water-soluble resin and an organic solvent (first organic solvent) having a higher vapor pressure than water to form a coating film of the mixture, and drying the coating film at a temperature of 50° C. or less. The mixture has a solid component ratio or 200 g/L or more.

Figure 4:
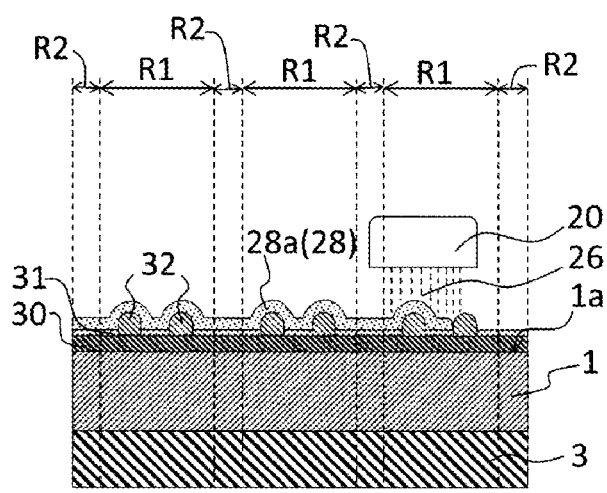
FIG. 4 is a schematic cross-sectional view for illustrating a coating film formed by applying a mixture containing a water-soluble resin and a solvent in a protective film formation step of the method according to the present embodiment.

FIG. 4 is a schematic cross-sectional view for illustrating a coating film formed by applying a mixture containing a water-soluble resin and a solvent in the protective film formation step of the method according to the present embodiment. As shown in FIG. 4, using a spray coating device, a protective film 28 is formed by spray-coating a mixture 26 from a nozzle 20 of the spray coating device, and drying the coating film 28a of the mixture 26. FIG. 4 shows an example in which a circuit layer including projection-shaped bumps 32 is formed in each of the plurality of element regions R1 on the front surface 1a of the substrate 1. Although the structure of the circuit layer is not particularly limited, here, a case is described where the circuit layer includes a multilayer wiring layer 30, an insulating protective layer 31 that protects the multilayer wiring layer 30, and projection-shaped bumps 32 connected to a terminal section of the multilayer wiring layer 30. The arrangement of the multilayer wiring layer 30 is not particularly limited, and the multilayer wiring layer 30 may be disposed in both the element regions R1 and the dividing regions R2 as shown in FIG. 4, or may be disposed only in the element regions R1.

According to the present disclosure, it is possible to easily dry droplets even at a temperature of 50° C. or less by using the first organic solvent, and setting the average particle size of the droplets to 12 µm or less. In addition, it is also possible to easily perform drying under atmospheric pressure. Furthermore, it is possible to suppress an increase in drying time even when the drying temperature is as low as 50° C. or less. The average particle size of the droplets is 12 µm or less, and may be 10 µm or less. In view of the fact that a protective film 28 having a large thickness can be easily formed, and the productivity can be more easily increased, the average particle size of the droplets is preferably 3 µm or more. The average particle size of the droplets can be controlled, for example, by selecting the type of the water-soluble resin, the type of the first organic solvent, the composition of the solvent contained in the mixture (e.g., the mixing ratio between the first organic solvent and water, which will be described below).

Note that the average particle size of the droplets can be determined, for example, by laser diffractometry.

The solid component ratio of the mixture 26 may be 200 g/L or more, and may be 230 g/L or more. When the solid component ratio is within such a range, it is possible to form a protective film having a large thickness with a small number of times of application operations even when using spray coating. From the viewpoint of ensuring high productivity, the solid component ratio of the mixture 26 may be 500 g/L or less.

The concentration of the solid component in the mixture 26 means the mass (g) per liter of the mixture 26 of the components contained in the mixture 26 other than the solvent (more specifically, the total weight of the components remaining after drying the coating film 28a of the mixture 26 (or after volatilizing the solvent in the mixture 26). It is sufficient that the solid component is solid before being dissolved in the solvent, and is usually in a state in which it is dissolved in the solvent in the mixture 26.

For spray coating, it is possible to use, for example, various spray coating devices such as two-fluid nozzle or ultrasonic coating devices. With a two-fluid nozzle spray coating device, the mixture 26 is spray-coated using a two-fluid nozzle including a liquid discharge port and a gas ejection port. With the two-fluid nozzle method, the mixture 26 discharged from the liquid discharge port is atomized by an air flow ejected from the ejection port provided around the liquid discharge port, and thus the droplets are sprayed. An ultrasonic coating device forms small droplets of the mixture 26 using ultrasonic waves or the like, and discharges the small droplets thus formed toward the front surface 1a of the substrate 1, thus depositing the small droplets. In view of the fact that droplets having a small average particle size can be easily formed, it is preferable to use two-fluid nozzle or ultrasonic spray coating. In particular, by spray-coating the mixture 26 to the front surface 1a of the substrate 1 using a two-fluid nozzle, it is possible to suppress dripping or the like even when the supply amount of the mixture 26 is increased, making it possible to spray droplets having a small particle size. Furthermore, it is possible to easily form a more uniform protective film 28 even when the thickness is increased.

With the use of the above-described mixture 26, the droplets of the mixture 26 will be substantially dried upon impacting on the front surface 1a of the substrate 1 or the surface of the coating film 28a.

The application of the mixture 26 may be performed at least once, but may be repeated a plurality of times. According to the present disclosure, the mixture 26 has a high solid component ratio, and it is therefore possible to increase the thickness of the protective film 28 with a smaller number of times of application. In the case of repeating the application of the mixture 26 a plurality of times, mixtures 26 having different compositions (components, concentrations and/or viscosities, etc.) may be used at respectively different times of application, or mixtures 26 having the same composition may be used at at least two times of application.

Examples of the water-soluble resin include a water-soluble polyester, polystyrene sulfonic acid, polyacrylic acid, polymethacrylic acid, polyacrylamide, 2-acrylamide-2-methylpropane sulfonic acid, polyvinyl pyrrolidone, polyethylene oxide, an oxazol-based water-soluble polymer (e.g., oxazol-2-ethyl-4,5-dihydro-homopolymer), or salts (e.g., alkali metal salt, ammonium salt) thereof. Examples of the alkali metal salt include a lithium salt, a sodium salt, and a potassium salt. The water-soluble resin may be used alone or in combination of two or more. In view of the fact that the solution can be easily prepared using an organic solvent, and a wide selection of organic solvents is available, it is preferable to use a water-soluble polyester, polystyrene sulfonic acid, an oxazol-based water-soluble polymer, or salts thereof. In view of the fact that high etching properties can be ensured in the laser grooving step, the water-soluble resin may be capable of absorbing laser light irradiated in the laser grooving step. Note that the laser light absorption of the water-soluble resin may also be regulated by introducing, into the water-soluble resin, a functional group (e.g., an aromatic ring, a carbonyl group, a nitrogen-containing group, a sulfur-containing group) having an absorption in the wavelength range of the laser light, or by regulating the amount of the functional group introduced.

The mixture 26 contains a first organic solvent having a higher vapor pressure than water. The vapor pressure of the first organic solvent at 25° C. may be higher than that of water (3.1 kPa), and is preferably 5 kPa or more, and more preferably 10 kPa or more or 20 kPa or more, from the viewpoint of easily suppressing the fluidization of the coating film 28a.

As the first organic solvent, a water-soluble organic solvent is preferable because of the high affinity for the water-soluble resin. The mixture 26 may further contain water, and the use of a water-soluble organic solvent as the first organic solvent makes the mixture 26 less likely to undergo phase separation even when the mixture 26 contains water, so that it is possible to form a uniform film.

Specific examples of the first organic solvent include methanol, ethanol, isopropyl alcohol (2-propanol), acetone, ethyl methyl ketone, and acetonitrile. The first organic solvent may be used alone or in a combination of two or more. Among these, it is preferable to use isopropyl alcohol, acetone, and/or ethanol. By using these organic solvents as the first organic solvent, it is possible to spray small droplets even when the solid component concentration is high, thus making is possible to easily form a more uniform protective film 28 even with a large thickness.

Note that it is preferable to select the combination of the water-soluble resin and the first organic solvent such that the water-soluble resin is in the dissolved state in the mixture at room temperature (25° C.). For example, in the case of using a water-soluble resin containing polystyrene sulfonic acid, it is preferable to use a first organic solvent containing acetone. In the case of using a water-soluble resin containing a water-soluble polyester, it is preferable to use a first organic solvent containing isopropyl alcohol.

The dissolved state of the water-soluble resin in the mixture 26 is also changed by adjusting the content of the water-soluble resin in the mixture 26, the content of the first organic solvent in the mixture 26, and/or the content of water if the mixture 26 contains water. Accordingly, the content of the water-soluble resin, the first organic solvent, and/or water may be adjusted such that the water-soluble resin is in the dissolved state in the mixture 26 at room temperature (25° C.).

The viscosity of the mixture 26 at 20° C. is, for example, 100 mPa·s or less, and may be 50 mPa·s or less. When the viscosity is in such a range, it is possible to spray small droplets even when the solid component concentration is high, so that it is possible to further increase the productivity.

Note that the viscosity of the mixture 26 is measured using a rotational viscometer at a shear rate of $1\ \text{s}^{-1}$.

If necessary, the mixture 26 may further contain an additive. For example, it is preferable that the mixture 26 contains a metal corrosion inhibitor since the corrosion of the electrode by water can be suppressed. Examples of the metal corrosion inhibitor include phosphoric acid salts, amine salts, and lower aliphatic acids and salts thereof. The metal corrosion inhibitor may be used alone or in a combination of two or more. From the viewpoint of increasing etching properties during laser grooving, the mixture 26 may optionally contain a photosensitizer that absorbs the laser light irradiated in the laser grooving step.

The pH of the mixture 26 is not particularly limited, and is preferably 5 or more and 8 or less, and may be 6 or more and 8 or less, from the viewpoint of inhibiting an electrode (especially, an electrode that uses an aluminum metal) from being corroded by the mixture 26.

Drying of the coating film 28a formed by application of the mixture 26 or the droplets impacted on the substrate 1 or the coating film 28a is performed at a temperature of 50° C. or less. By using the above-described mixture 26, drying can be performed at a relatively low temperature of 50° C. or less even in the case of forming a protective film 28 having a large thickness for plasma etching. Since drying can be performed at such a temperature, it is possible to suppress the formation of bubbles in the protective film 28, and also to suppress the alteration or degradation of the protective film 28. Accordingly, the protective film 28 can be easily removed using an aqueous liquid cleaner or the like. Since it is possible to inhibit bubbles from forming portions with a small thickness in the protective film 28, it is possible to suppress the damage caused by plasma in the dicing step. Furthermore, when drying is performed at such a temperature, the degradation of the dicing tape can also be suppressed. Drying may be performed at a temperature less than 50° C., or may be performed at 40° C. or less. Usually, drying is performed at room temperature (e.g., 20° C. or more and 35° C. or less).

Drying may be performed either under atmospheric pressure or under reduced pressure. By using the mixture 26 having the above-described composition, it is possible to easily form a highly uniform protective film 28 in a short period of time, also under atmospheric pressure, even when drying is performed at a temperature of 50° C. or less. In general, in the case of performing drying under reduced pressure, bubbles tend to be formed in the protective film 28 particularly when the protective film 28 has a large thickness. However, by using the mixture 26 having the above-described composition, it is possible to easily form a protective film 28 with the formation of bubbles being suppressed, even when drying is performed under reduced pressure. In addition, drying time can be further shortened by performing drying under reduced pressure. From the viewpoint of increasing the effect of suppressing the formation of bubbles in the protective film 28, drying may be performed while reducing the ambient pressure. At this time, the pressure may be reduced continuously, or may be reduced stepwise.

The thickness of the protective film 28 that is formed in the present step can be regulated according to, for example, the degree of irregularities on the front surface 1a of the substrate 1 or the plasma etching condition in the dicing step. In the present disclosure, dicing is performed by plasma etching, and it is therefore necessary to increase the thickness of the protective film 28 as compared with the conventional dicing using a cutting blade, laser etching or the like. The thickness of the protective film 28 is, for example, 1 μm or more, preferably 2 μm or more, and may be 3 μm or more or 5 μm or more, or may be greater than 5 μm. In many cases, a protective film having a thickness of about 5 to 70 μm is applied in order to avoid exposure to plasma during plasma dicing.

Note that the thickness of the protective film 28 can be determined according to the following procedure, based on the layer structure of the substrate, the etching properties of each of the layers, and the etching properties of the water-soluble protective film.

The layer structure of the substrate includes, for example, a device layer/a Si layer/an insulating film layer (e.g., a $SiO_2$ layer)/a resin layer (e.g., a die attach film layer) in this order from the upper layer side. The protective film 28 is formed so as to cover the device layer. The layer structure of the substrate is not limited to this example, and may include, for example, a Si layer/a resin layer/a Si layer. Here, the method for determining the thickness of the protective film will be described, taking, as an example, a case where the layer structure of the substrate includes a device layer/a Si layer/an insulating film layer (e.g., a $SiO_2$ layer)/a resin layer (e.g., a die attach film layer) in this order from the upper layer side. Note that, for the dicing of the substrate, it is necessary to cut the protective film 28, the device layer, the Si layer, the insulating film layer, and the resin layer in the dividing regions. Since the cutting of the protective film 28 and the device layer in the dividing regions is performed by laser grooving, the objects to be cut in the plasma dicing are the Si layer, the insulating film layer, and the resin layer. The thickness of the protective film 28 needs to be set such that the protective film 28 covering the element regions will not be eliminated completely while the Si layer, the insulating film layer, and the resin layer are being removed by plasma etching.

The thickness T of the water-soluble protective film can be determined by the following mathematical expression:

$T$=(Thickness of Si layer/$A \times \alpha$)+(Thickness of insulating film layer/$B \times \beta$)+(Thickness of resin layer/$C \times \gamma$)+D (where A represents the ratio (selection ratio) between the etching rate of the water-soluble protective film and the etching rate of the Si layer under the conditions for performing plasma etching of the Si layer; B represents the ratio (selection ratio) between the etching rate of the water-soluble protective film and the etching rate of the insulating film layer under the conditions for performing plasma etching of the insulating film layer; C represents the ratio (selection ratio) between the etching rate of the water-soluble protective film and the etching rate of the resin layer under the conditions for performing plasma etching of the resin layer; D represents the residual thickness of the protective film that is to be left on the element regions after plasma dicing; α represents the margin value for over etching the Si layer; β represents the margin value for over etching the insulating film layer; and γ represents the margin value for over etching the resin layer.)

The residual thickness D of the protective film is determined taking into consideration, for example, the surface level difference in the element regions, the coverage of the water-soluble protective film and/or the uniformity of the water-soluble protective film. The residual thickness D is set to be, for example, preferably about 1 to 5 μm. α, β, and γ are each determined taking into consideration, for example, the thickness of the corresponding layer and/or the etching uniformity. α, β, and γ are each set to be, for example, about 1.1 to 1.2.

The selection ratio between each of the layers and the water-soluble protective film is determined according to, for example, the element structure and/or the plasma etching conditions of each of the layers. The selection ratio A is 50 to 100, for example. The selection ratio B is 1 to 5, for example. The selection ratio C is 0.5 to 2, for example.

In terms of productivity and/or cost, the thickness of the water-soluble protective film is preferably set within such a range that the residual film is left, in view of the selection ratio obtained from the above-described expression and the actual processing conditions.

(c) Laser Grooving Step

Figure 5:
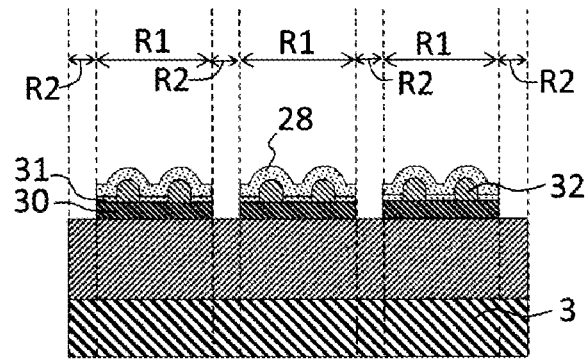
FIG. 5 is a schematic cross-sectional view for illustrating a laser grooving step.

FIG. 5 is a schematic cross-sectional view for illustrating a laser grooving step. In the laser grooving step, the portions of the protective film 28 that cover the dividing regions R2 are irradiated with laser light, to remove the protective film 28 in these portions, and expose the front surface 1a of the substrate 1 in the dividing regions R2. When the multilayer wiring layer 30 and the insulating protective layer 31 that protects the multilayer wiring layer 30 are disposed under the protective film 28 that covers the dividing regions R2 of the substrate, the multilayer wiring layer 30 and the insulating protective layer 31 are also removed by irradiation with laser light, to expose the front surface 1a of the substrate 1 in the dividing regions R2. Consequently, a predetermined pattern is formed by the remaining protective film 28.

The processing by laser grooving can be performed in the following manner. As the laser light source, it is possible to use, for example, a UV-wavelength nanosecond laser. Then, the portions of the protective film 28 that cover the dividing regions R2 are irradiated with the laser light, to remove the protective film 28 in these portions. The irradiation conditions are not particularly limited, and the laser light may be irradiated, for example, with a pulse cycle of 200 kHz, an output of 0.3 W, and a scan rate of 400 mm/sec. When the multilayer wiring layer 30 is disposed under the protective film 28 on the dividing regions R2, the processing by laser grooving may be performed in the following manner. First, irradiation of the dividing regions R2 with the laser light is performed twice with a pulse cycle of 200 kHz, an output of 0.3 W, and a scan rate of 400 mm/sec, to remove the protective film 28. Thereafter, irradiation of the dividing regions R2 with the laser light is performed once with a pulse cycle of 100 kHz, an output of 1.7 W, and a scan rate of 400 mm/sec, to remove the multilayer wiring layer 30. Although the processing conditions of the nanosecond laser are described here as an example, the laser is not limited to the nanosecond laser. As the laser, it is possible to use, for example, sub-picosecond to sub-nanosecond lasers. For the pulse width of this range, a processing phenomenon called thermal processing is predominant, and it is therefore possible to use the method according to the present disclosure.

The wavelength of the laser light that is irradiated is 200 nm or more 430 nm or less, for example. From the viewpoint of increasing the precision of the groove formation during the laser grooving, the wavelength is preferably 250 nm or more and 360 nm or less. With the use of the laser light with such a wavelength, it is possible to easily form a groove having a small width.

During laser grooving, the temperatures of the substrate 1 and the holding sheet 3 are preferably maintained at 50° C. or less.

(d) Dicing Step (Plasma Etching Step)

Figure 6:
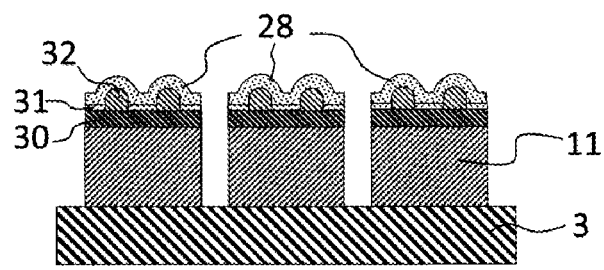
FIG. 6 is a schematic cross-sectional view for illustrating element chips that have been diced by a dicing step.

FIG. 6 is a schematic cross-sectional view for illustrating element chips that have been diced by a dicing step. In the dicing step, in the dividing regions R2 of the substrate 1 shown in FIG. 5, which have been exposed in the laser grooving step, plasma etching is performed from the front surface 1a to the back surface 1b of the substrate 1 to attain the state shown in FIG. 6, to dice the substrate 1 into element chips 11 corresponding to a plurality of element regions R1. In the present step, plasma etching is performed using a patterned protective film 28 as a mask.

In the following, the plasma etching step and an example of a dry etching apparatus (or plasma treatment apparatus) used therein will be described.

Figure 8:
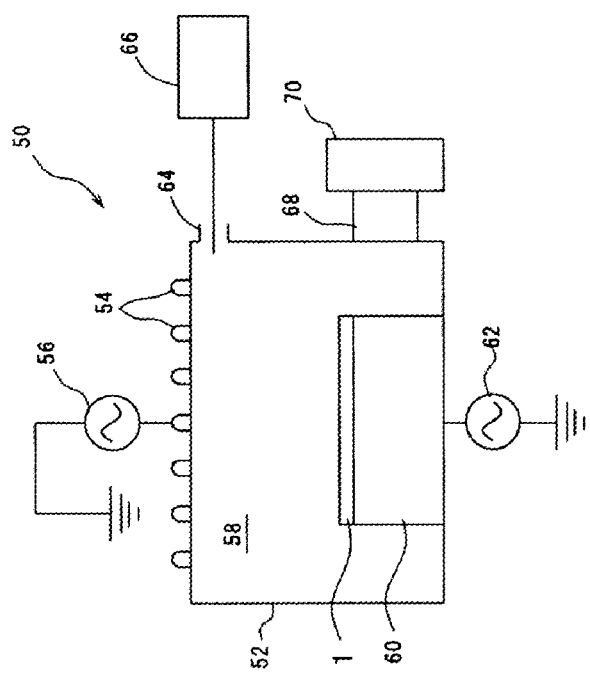
FIG. 8 is a schematic diagram showing an example of a dry etching apparatus.

FIG. 8 is a schematic diagram showing an example of a dry etching apparatus 50 used in the present step. A dielectric window (not shown) is provided at the top of a chamber 52 of the dry etching apparatus 50, and antennas 54 serving as upper electrodes are disposed above the dielectric window. The antennas 54 are electrically connected to a first high-frequency power supply section 56. On the other hand, a stage 60 on which the substrate 1 fixed to the transport carrier 4 is to be disposed is disposed on the bottom side of a processing room 58 in the chamber 52. A refrigerant flow channel (not shown) is formed inside the stage 60, and the stage 60 is cooled by circulating a refrigerant through the refrigerant flow channel. The stage 60 also functions as a lower electrode, and is electrically connected to a second high-frequency power supply section 62. In addition, the stage 60 includes an electrostatic chucking electrode (ESC electrode), which is not shown, and the substrate 1 that is fixed to the transport carrier 4 placed on the stage 60 can be electrostatically chucked to the stage 60. In addition, the stage 60 is provided with a cooling gas hole (not shown) for supplying a cooling gas, and the substrate 1 that is fixed to the transport carrier 4 electrostatically chucked to the cooled stage 60 can be cooled by supplying a cooling gas such as helium from the cooling gas hole. A gas introduction port 64 of the chamber 52 is fluidly connected to an etching gas source 66, and an exhaust port 68 is connected to a vacuum evacuation section 70 including a vacuum pump for vacuum evacuating the chamber 52.

After the transport carrier 4 and the substrate 1 shown in FIG. 3 have been placed on the stage 60 in the chamber 52, the pressure inside the chamber 52 is reduced using the vacuum pump, and a predetermined process gas is introduced into the chamber 52. Then, the dividing regions R2 of the substrate 1 in the chamber 52 are dry-etched by a plasma of the process gas that has been formed by supplying high-frequency power to the antennas 54 (plasma source), and the substrate 1 is divided into a plurality of element chips 11 including the element regions R1, as shown in FIG. 6.

The dry etching apparatus 50 also includes a control device that controls the process gas source, an ashing gas source, the vacuum pump, and the high-frequency power supply sections 56 and 62, and controls the above-described constituent elements so as to perform plasma etching under the optimized dry etching conditions.

If the substrate 1 is made of silicon, etching can be performed by the BOSCH method in the plasma etching step. In the BOSCH method, a plasma for depositing a protective film and a plasma for etching silicon are alternately generated. The plasma for depositing a protective film may be generated for about 2 to 10 seconds, for example, by adjusting the chamber pressure to 20 Pa while supplying $C_4F_8$ at 300 sccm, and applying RF power of 2000 to 5000 W to the antennas 54. The plasma for etching silicon may be generated for about 5 to 20 seconds, for example, by adjusting the chamber pressure to 20 Pa while supplying $SF_6$ at 600 sccm, and applying RF power of 2000 to 5000 W to the antennas 54 and applying LF power of 50 to 500 W to the lower electrode. Note that, in order to suppress notching in the processed shape of the substrate 1 (the semiconductor layer), the RF power applied to the lower electrode may be applied in a pulsed manner. By repeating the generation of the plasma for depositing a protective film and the plasma for etching silicon, for example, for about 20 cycles, the substrate 1 having a thickness of 100 μm can be etched and divided into the element chips 11. Note that, in order to reduce the thermal damage caused by the plasma generated in the plasma etching step, it is preferable that the transport carrier 4 and the substrate 1 are cooled in the plasma etching step. For example, the transport carrier 4 and the substrate 1 can be cooled by applying a DC voltage of 3 kV to the ESC electrode while regulating the temperature of the stage 60 to 20° C. or less, and supplying 50 to 200 Pa of He as a cooling gas between the holding sheet 3 and the stage 60. If the substrate 1 has a thickness less than or equal to a predetermined thickness (e.g., 30 μm or less), silicon may be continuously etched without using the BOSCH method.

Molten debris of the metals, the insulators, and Si contained in the multilayer wiring layer 30, the insulating protective layer 31, and the protective film 28 may be attached to the dividing regions R2 exposed by laser grooving. When the above-described etching of silicon by the BOSCH method or the like is performed in a state in which the debris are attached, the debris may cause a columnar residue and etching stop, or may roughen the mask surface. Therefore, before performing the etching of silicon by the BOSCH method or the like, it is preferable to perform plasma etching under strongly ionic conditions, thus removing the debris attached to the dividing regions R2. This can prevent the generation of a columnar residue or etching stop during the etching of silicon by the BOSCH method or the like, achieve a good processed shape and improve the processing stability. As the plasma used for removing debris, it is preferable to use a gaseous species capable of removing silicon and a silicon oxide layer. For example, the plasma may be generated by adjusting the chamber pressure to 5 Pa while supplying a mixed gas of $SF_6$ and $O_2$ at 200 sccm, and applying RF power of 1000 to 2000 W to the antennas 54, and debris may be exposed to the plasma for about 1 to 2 minutes. At this time, the debris removing effect can be increased by applying LF power of about 150 W to the lower electrode included in the stage 60.

(e) Protective Film Removal Step

Figure 7:
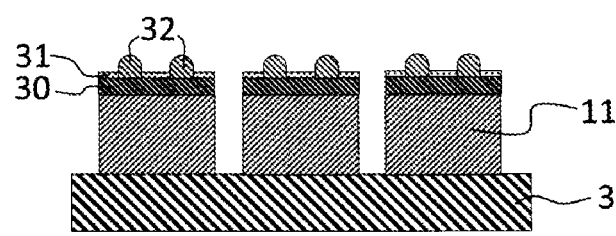
FIG. 7 is a schematic cross-sectional view for illustrating the element chips in a state in which the protective film has been removed.

FIG. 7 is a schematic cross-sectional view for illustrating the element chips in a state in which the protective film has been removed. In the protective film removal step, the portions of the protective film 28 that cover the element regions R1 are removed on the element chips 11, which have been diced in the dicing step, as shown in FIG. 6. Since the protective film 28 contains a water-soluble resin, the protective film 28 on the element chips 11 can be easily removed by being brought into contact with an aqueous liquid cleaner.

As the aqueous liquid cleaner, it is possible to use water, or use a solvent mixture of water and an organic solvent. As the organic solvent, it is possible to use, for example, any of the organic solvents shown as the examples of the solvent for forming the protective film 28. If necessary, the aqueous liquid cleaner may contain an additive. Examples of the additive include an acid, a surfactant, and a metal corrosion inhibitor.

It is sufficient that the aqueous liquid cleaner is brought into contact with the protective film 28, and it is possible to efficiently remove the protective film 28 by spraying the aqueous liquid cleaner thereto by two-fluid spraying or the like. To perform more efficient cleaning, it is possible to roughly remove the protective film by rinsing, thereafter perform cleaning by two-fluid spraying, and finally perform washing off.

In the removal step, before bringing the protective film 28 into contact with the aqueous liquid cleaner, the surface of the protective film 28 may be subjected to a plasma containing oxygen (be subjected to ashing treatment), to partially remove the protective film 28. When performing plasma etching, a layer resulting from modification or curing of the constituent materials of the protective film 28 may be formed on the surface of the protective film 28. However, such a layer can be removed by ashing treatment, so that it is possible to easily remove the protective film 28 by using the aqueous liquid cleaner.

The ashing treatment may be subsequently performed in the chamber 52 in which the plasma etching in the dicing step has been performed. In the ashing treatment, the protective film 28 can be removed from the front surface 1a of the substrate 1 in the chamber 52 by using a plasma of an ashing gas (e.g., oxygen gas) formed by introducing the ashing gas into the chamber 52, and similarly supplying high-frequency power to the antennas 54 (plasma source).

In the ashing treatment, the processing room 58 shown in FIG. 8 is vacuum evacuated by the vacuum evacuation section 70, and an etching gas containing, for example, oxygen is supplied from the etching gas source 66 into the processing room 58. Then, the pressure inside the processing room 58 is maintained at a predetermined pressure, and high-frequency power is supplied from the first high-frequency power supply section 56 to the antennas 54, to generate a plasma in the processing room 58, and the substrate 1 is irradiated with the plasma, i.e., the surface of the protective film 28 is subjected to the plasma. At this time, by physicochemical action between radicals and ions in the plasma, the protective film 28 is partially removed (light ashing). Accordingly, it is possible to easily remove the protective film 28 by using the above-described aqueous liquid cleaner.

The method according to the present disclosure is suitable for use in forming an element chip by plasma etching.

The present invention has been described by way of preferred embodiments at present, but the disclosure should not be construed as liming the scope of the present invention. Various variations and modifications will become clearly apparent to those skilled in the art to which the present invention pertains upon reading the disclosure given above. Accordingly, the scope of the appended claims should be construed to encompass all variations and modifications without departing from the true spirit and scope of the present invention.

REFERENCE NUMERALS

1: Substrate, 1a: First surface (front surface), 1b: Second surface (back surface), R1: Element region, R2: Dividing region, 2: Frame, 2a: Opening, 2b: Notch, 2c: Corner cut, 3: Holding sheet, 3a: Adhesive surface, 3b: Non-adhesive surface, 4: Transport carrier, 11: Element chip, 20: Nozzle, 26: Mixture, 28a: Coating film, 28: Protective film, 30: Multilayer wiring layer, 31: Protective layer, 32: Bump, 50: Dry etching apparatus, 52: Chamber, 54: Antenna, 56: First high-frequency power supply section, 58: Processing room, 60: Stage, 62: Second high-frequency power supply section, 64: Gas introduction port, 66: Etching gas source, 68: Exhaust port, 70: Vacuum evacuation section

What is claimed is:

1. A method for manufacturing an element chip, comprising:
   a preparation step of preparing a substrate, the substrate having a first surface and a second surface opposite to the first surface, and including a plurality of element regions and dividing regions defining the element regions, the substrate being held on a holding sheet on the second surface side;
   a protective film formation step of spray coating, to the first surface of the substrate, a mixture containing a water-soluble resin and an organic solvent having a higher vapor pressure than water to form a coating film of the mixture, and drying the coating film at a temperature of 50° C. or less, to form a protective film containing the water-soluble resin;
   a laser grooving step of irradiating, with laser light, portions of the protective film that cover the dividing regions, to remove the portions covering the dividing regions, and expose the first surface of the substrate in the dividing regions;
   a dicing step of dicing the substrate into a plurality of element chips by plasma etching the substrate from the first surface to the second surface in the dividing regions in a state in which the element regions are covered by the protective film; and
   a removal step of removing the portions of the protective film that cover the element regions,
   wherein the mixture has a solid component ratio of 200 g/L or more, and
   droplets of the sprayed mixture have an average particle size of 12 μm or less.

2. The method for manufacturing an element chip according to claim 1,
   wherein the mixture has a viscosity of 100 mPa·s or less at 20° C.

3. The method for manufacturing an element chip according to claim 1,
   wherein the droplets of the mixture have an average particle size of 3 μm or more.

4. The method for manufacturing an element chip according to claim 1,
   wherein the mixture is spray-coated from a two-fluid nozzle.

5. The method for manufacturing an element chip according to claim 1,
   wherein the organic solvent contains at least one selected from the group consisting of isopropyl alcohol, ethanol, acetone, and methyl ethyl ketone.

6. The method for manufacturing an element chip according to claim 1,
   wherein the drying is performed under atmospheric pressure.

* * * * *